(12) United States Patent
Kurtz et al.

(10) Patent No.: US 8,040,931 B2
(45) Date of Patent: Oct. 18, 2011

(54) DUAL LAYER COLOR-CENTER PATTERNED LIGHT SOURCE

(75) Inventors: Anthony D. Kurtz, Saddle River, NJ (US); Joseph R. VanDeWeert, Maywood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 13/045,276

(22) Filed: Mar. 10, 2011

(65) Prior Publication Data

US 2011/0159617 A1  Jun. 30, 2011

Related U.S. Application Data

(60) Continuation of application No. 11/827,170, filed on Jul. 11, 2007, now abandoned, which is a division of application No. 10/934,251, filed on Sep. 3, 2004, now Pat. No. 7,260,127, which is a continuation of application No. 10/120,698, filed on Apr. 11, 2002, now Pat. No. 6,795,465.

(51) Int. Cl.
*H01S 3/16* (2006.01)

(52) U.S. Cl. ............................... 372/42; 372/66; 372/68

(58) Field of Classification Search .................. 372/42, 372/66, 68
See application file for complete search history.

(56) References Cited

U.S. PATENT DOCUMENTS

| | | | | |
|---|---|---|---|---|
| 3,512,969 | A * | 5/1970 | Robillard | 430/338 |
| 3,720,926 | A | 3/1973 | Schneider | |
| 4,091,375 | A | 5/1978 | Robillard | |
| 4,110,004 | A * | 8/1978 | Bocker | 359/487.02 |
| 4,124,804 | A * | 11/1978 | Mirell | 378/6 |
| 4,166,254 | A * | 8/1979 | Bjorklund | 372/24 |
| 4,183,795 | A * | 1/1980 | Bloom et al. | 204/157.41 |
| 4,318,978 | A | 3/1982 | Borrelli et al. | |
| 4,361,645 | A | 11/1982 | Robillard | |
| 4,519,082 | A | 5/1985 | Schneider | |
| 4,638,485 | A | 1/1987 | Gellermann et al. | |
| 4,649,518 | A | 3/1987 | Sadjian | |
| 4,811,289 | A * | 3/1989 | Sadjian | 365/119 |
| 4,833,333 | A * | 5/1989 | Rand | 250/492.3 |
| 4,839,009 | A | 6/1989 | Pollock et al. | |
| 4,841,293 | A | 6/1989 | Takimoto | |
| 4,963,755 | A * | 10/1990 | Chen | 250/492.3 |
| 4,990,322 | A | 2/1991 | Pollock et al. | |
| 5,267,254 | A | 11/1993 | Schneider et al. | |
| 5,581,499 | A * | 12/1996 | Hamamdjian | 365/106 |
| 5,680,231 | A | 10/1997 | Grinberg et al. | |
| 5,764,389 | A | 6/1998 | Grinberg et al. | |
| 5,796,762 | A | 8/1998 | Mirov et al. | |
| 5,889,804 | A * | 3/1999 | Takiguchi | 372/42 |
| 5,920,666 | A * | 7/1999 | Digonnet et al. | 385/16 |
| 6,996,137 | B2 * | 2/2006 | Byren et al. | 372/10 |

\* cited by examiner

*Primary Examiner* — Hrayr A Sayadian
(74) *Attorney, Agent, or Firm* — Troutman Sanders LLP; James E. Schutz; Jihan A.R. Jenkins (57) ABSTRACT

A method of fabricating a color laser, comprising growing a first thin layer of ionic crystal on a substrate. The crystal can comprise many types of ionic crystals, such as sodium chloride or potassium chloride. A second thin layer of a different type of ionic crystal can be deposited above the first ionic crystal layer, such as lithium fluoride or sodium fluoride. An inert metal layer can be deposited between the first and second layers of ionic crystal and above the second layer of ionic crystal. When the first and second ionic crystal layers are radiated with gamma rays, they form color centers at the spots radiated. Because of the difference in crystalline properties of the two different ionic crystal centers, their color centers have different wavelengths. Each of the ionic crystal layers emit light at different characteristic wavelengths when illuminated at their unique absorption frequencies, and can be made to lase separately.

18 Claims, 7 Drawing Sheets

PRINCIPAL BULK CHARACTERISTICS OF ALKALI HALIDE CRYSTALS

| CRYSTAL | STRUCTURE | CATION–ANION DISTANCE* (Å) | EXCITION ENERGY* (eV) | MADELUNG ENERGY* (eV) | $f_z'$ | $f_B'$ | RESTSTRAHL PEAKS* $\lambda_R$ | |
|---|---|---|---|---|---|---|---|---|
| | | | | | | | $\mu$ | $"_k$ |
| CsI | sc | 3.956 | 5.30 | 6.37 | 2.62 | 6.59 | 152.0 | 94.6 |
| RbI | fcc | 3.671 | 5.73 | 6.79 | 2.59 | 4.91 | 122.5 | 117.5 |
| KI | fcc | 3.533 | 5.88 | 7.06 | 2.62 | 5.10 | 92.3 | 156 |
| NaI | fcc | 3.237 | 5.61 | 7.73 | 2.93 | 7.28 | 85.8 | 167 |
| LiI | fcc | 3.000 | 5.94 | 8.19 | 3.80 | 16.85 | – | – |
| CsBr | sc | 3.720 | 6.83 | 6.76 | 2.42 | 6.67 | 126.0 | 114 |
| RbBr | fcc | 3.445 | 6.64 | 7.26 | 2.34 | 4.86 | 103.4 | 139 |
| KBr | fcc | 3.298 | 6.71 | 7.58 | 2.34 | 4.90 | 86.7 | 166 |
| NaBr | fcc | 2.989 | 6.71 | 8.37 | 2.59 | 6.28 | 73.9 | 195 |
| LiBr | fcc | 2.751 | 7.23 | 9.02 | 3.17 | 13.25 | 62.9' | 229 |
| CsCl | sc | 3.571 | 7.85 | 7.05 | 2.62 | 7.20 | 95.2 | 151 |
| RbCl | fcc | 3.291 | 7.54 | 7.64 | 2.19 | 4.92 | 78.8 | 183 |
| KCl | fcc | 3.147 | 7.79 | 7.94 | 2.19 | 4.84 | 67.1' | 215 |
| NaCl | fcc | 2.820 | 7.96 | 8.86 | 2.34 | 5.90 | 58.8' | 245 |
| LiCl | fcc | 2.570 | 8.67 | 9.68 | 2.78 | 11.95 | 52.2' | 276 |
| CsF | fcc | 3.004 | 9.27 | 8.29 | 2.16 | – | 115.0' | 125 |
| RbF | fcc | 2.815 | 9.54 | 8.81 | 1.96 | 6.48 | 64.1 | 224 |
| KF | fcc | 2.674 | 9.88 | 9.33 | 1.85 | 5.46 | 52.6' | 274 |
| NaF | fcc | 2.317 | 10.66 | 10.77 | 1.74 | 5.05 | 40.6' | 354 |
| LiF | fcc | 2.014 | 12.94 | 12.37 | 1.96 | 9.01 | 32.6' | 442 |

DUAL LAYER COLOR-CENTER PATTERNED LIGHT SOURCE

CROSS-REFERENCE TO RELATED APPLICATIONS

This application is a continuation of U.S. application Ser. No. 11/827,170, filed Jul. 11, 2007 now abandoned, which is a divisional of U.S. application Ser. No. 10/934,251, filed Sep. 3, 2004, now U.S. Pat. No. 7,260,127, which issued on Aug. 21, 2007, which is a continuation of U.S. application Ser. No. 10/120,698 filed Apr. 11, 2002, now U.S. Pat. No. 6,795,465, which issued on Sep. 21, 2004, the entire disclosures of which are hereby incorporated by reference as if being set forth in their entireties herein.

FIELD OF INVENTION

The present invention relates to forming and utilizing defects formed in ionic crystal.

BACKGROUND OF THE INVENTION

The use of color centers in ionic crystals has been known for some time. A color center laser, for example, is a known light source that operates on a basis of random defects formed in an ionic crystal. See U.S. Pat. No. 5,889,804 entitled, "Artificial Color Center Light Source" which issued on Mar. 3, 1999 to Y. Takiguchi. In that patent there is described a color center light source where a color center is formed artificially. A predetermined single atom is removed from the surface of a defect-free ionic crystal so as to form a lattice defect. Optical transition of the defect is utilized so that it functions as a light source. In the past, these color centers have been formed by methods such as exposing the crystals to gamma radiation or heating in the presence of excess cations or other impurities. These methods cause anions to be displaced from the crystal lattice. The hole left by the cation can then be filled by an excess electron that is attracted to the void due to the positive ions surrounding it. The electron can then be treated as if in a potential well whose size is smaller than the wavelength of the electron; such a well has discrete energy levels which can be predicted quite easily. When an incident photon hits the trapped electron it will be absorbed if the energy of the photon is the same as the difference between the two energy levels of the electron in the well; this will also cause the electron to be excited into the higher energy state. In this way the electron can be used to absorb only select wavelengths of light that correspond to the energy levels in the well. Once the electron is in an excited state, the surrounding crystal will relax, thereby changing the energy gap between the excited and ground states of the potential well. When the electron decays back into the ground state it will emit a photon with different energy and therefore a different wavelength than the incident photon. This is commonly referred to as an F-center type color center, so called because the absorption of discrete wavelengths gives a unique color to the ionic crystal. In general, for most ionic crystals, an F-Center has an absorption peak within the visible light spectrum, however when an excited electron decays back to the ground state it does so over a smaller energy gap and emits light of a longer wavelength. There are other types of color centers such as $F_A$, $F_B$, $F_2+$, and others which can be created through various types of annealing and bombardment by radiation. The other color centers are caused by various other impurities and dislocations present in the crystal and they will each absorb and emit at different areas of the spectrum.

Use of color centers has been employed in the prior art. See for example, the above-noted patent, U.S. Pat. No. 5,889,804. See also U.S. Pat. No. 4,990,322 entitled, "NACL:OH Color Center Laser" which issued on Feb. 5, 1991 to C. R. Pollock et al. and is assigned to Cornell. See also U.S. Pat. No. 4,839,009 entitled, "NACL:ON Color Center Laser" which issued on Jun. 13, 1989 to C. R. Pollock et al. See U.S. Pat. No. 4,638,485 entitled, "Solid State Vibrational Lasers Using F-Center/Molecular-Defect Pairs in Alkali Halides" which issued on Jan. 20, 1987 to W. Gellermann et al. See also U.S. Pat. No. 5,267,254 entitled, "Color Center Laser with Transverse Auxiliary Illumination" which issued on Nov. 30, 1993 to I. Schneider et al.

In most of these patents the color centers are created throughout the ionic crystal so that the whole crystal can be used to lase light. A notable exception to this is the point light source patent where a scanning electron microscope is used to create a single F-center dislocation to be used as a point light source. In all cases only a single type of ionic crystal is used so that there is only one absorption and emission peak.

It is an object of the present invention to provide an apparatus and a method of forming and utilizing defects formed in the ionic crystals.

SUMMARY OF INVENTION

In the present invention a thin layer of ionic crystal is grown on a substrate. The crystal could be of any type of ionic crystal such as NaCl or KCl. The crystal could be a pure form of the chosen compound or could contain contaminates which would shift the wavelength of the created color centers. On top of the thin layer, a second thin layer of a different type of ionic crystal is deposited. The second layer, for example, can be LiF or NaF. When these two layers are irradiated with gamma rays, they will each form color centers at the spots which are irradiated. Because of the differences in crystal properties of the two different ionic crystal layers, their color centers will be at different wavelengths. For instance, NaCl absorbs light at a wavelength of 459.6 nm while LiF absorbs light at 248.2 nm. Once the F-center has absorbed light of a certain wavelength, it will eventually decay and emit light at a different higher wavelength. Accordingly the two separate ionic crystals also emit light at different characteristic wavelengths when illuminated at their unique absorption frequencies. Each layer can be made to lase separately. It is important to make sure that the top layer has absorption energy greater than that of the bottom layer. This way the lower light energy of the bottom layers absorption peak will pass through the top layer and be absorbed only by the bottom layer. By selectively exposing different areas of each layer of the crystals to gamma radiation, it is possible to create unique areas in each layer that contain color centers. If the crystal layers are exposed to light at the wavelength characteristic of the absorption of one layer of crystal, that layer's pattern will be apparent and emit light at its emission wavelength. In any event, if the device is exposed to light of the second layer's absorption wavelength, then the second pattern will be exposed and light will be emitted at its characteristic emission wavelength. Thus, as one can ascertain, by the utilization of the above-noted invention, two different wavelengths of light can be emitted in a single device.

DETAILED DESCRIPTION

Figure 1:
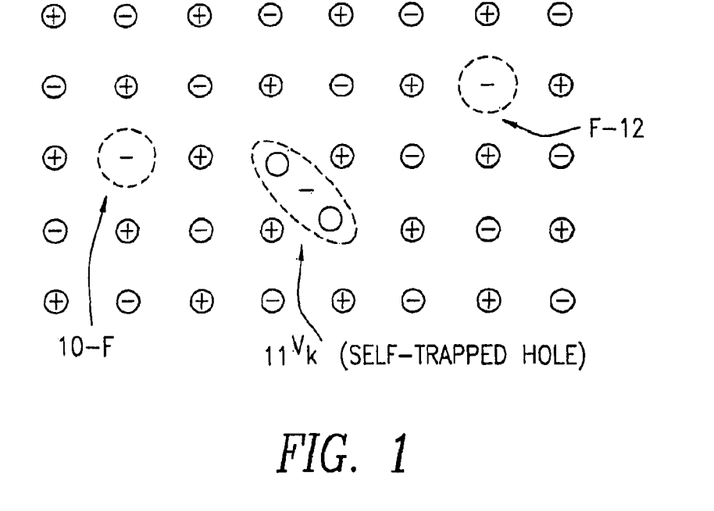
FIG. 1 shows several different types of color centers (F) which can be produced in an ionic crystals.

Referring to FIG. 1, there is shown several different types of color centers which can be produced in ionic crystals, including the F-center depicted by reference numeral 10. The name F-center comes from the German word for color, Farbe. F-centers can be produced by heating a crystal in excess alkali vapor or by x-irradiation. The central absorption band (the F-band) associated with F-centers in several alkali halides is well known. The F-center has been identified by electron spin resonance as an electron bound at a negative ion vacancy. The F-center 10 of FIG. 1 is a negative ion vacancy with one excess electron bound at the vacancy. Reference numeral 11 refers to a self-trapped hole, which essentially shows two vacancies where two holes are indicated by reference numeral 11. There is also shown another F-center 12 in FIG. 1.

As one can understand, the lattice vacancies are well known and reference is made to the above-noted patents. One can also understand that the simplest imperfection is a lattice vacancy, which is a missing atom or ion, which is also known as a Schottky defect. A Schottky defect in a perfect crystal can be created by transferring an atom from a lattice site in the interior to a lattice site on the surface of the crystal. In thermal equilibrium a certain number of lattice vacancies are always present in an otherwise perfect crystal, because the entropy is increased by the presence of disorder in the structure.

Figure 2:
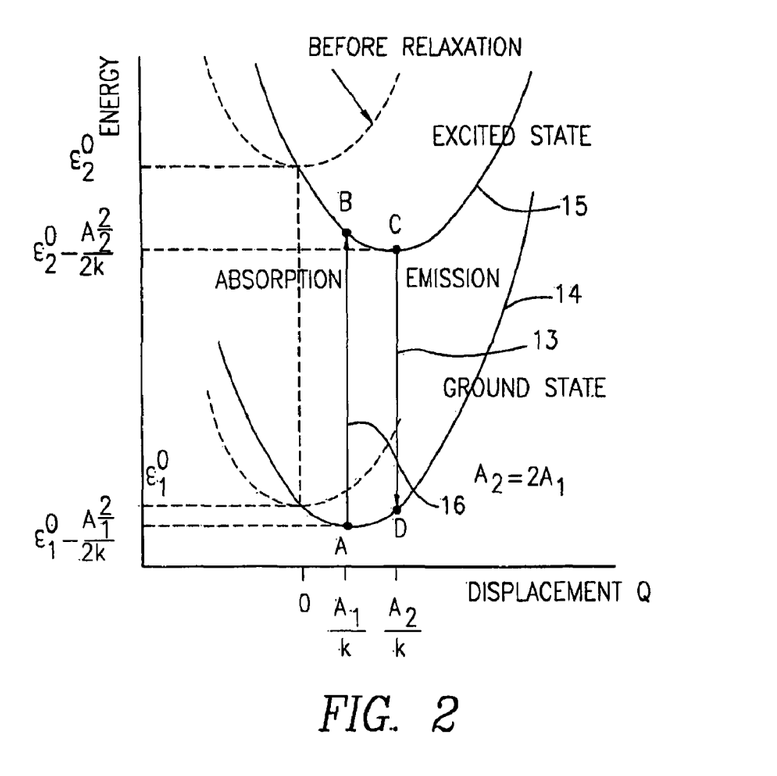
FIG. 2 is a graph depicting the energy gap between the ground state and the excited state, as it varies with the distance between surrounding anions.

Referring to FIG. 2, there is shown a graph of energy versus displacement and depicts the energy gap between the ground state depicted by reference numeral 14 and the excited state 15. This is depicted as it varies with the distance between surrounding anions. It can be seen that the energy of absorption 16 is greater than that of emission 13. This is due to the shift in energy levels with the relaxation of the crystal after absorption.

Figure 3:
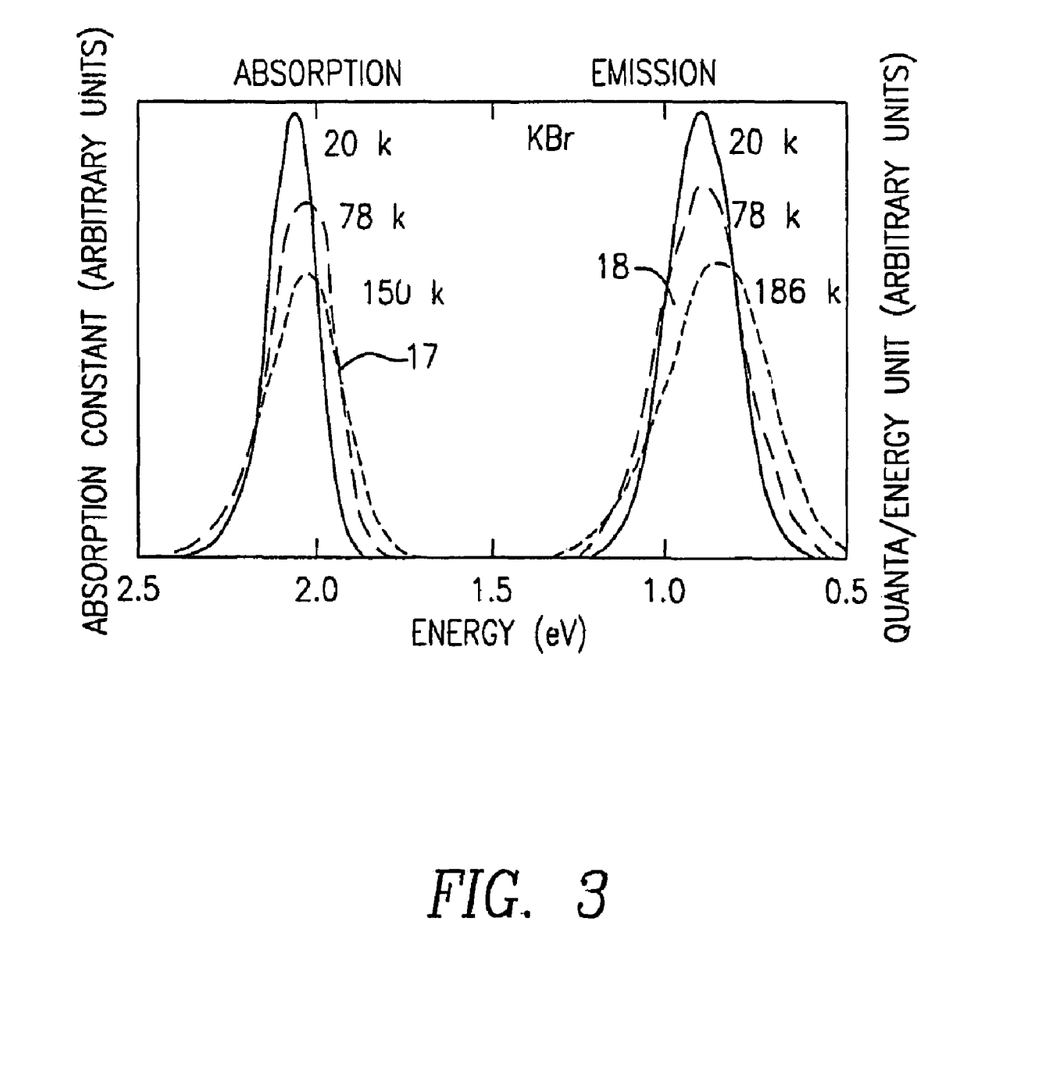
FIG. 3 is a graph depicting the energy of the absorption and emission in an F-center.

Referring to FIG. 3, there is shown the energy absorption 17 and emission 18 in a KBr F-center. It can be seen that the energy of emission 18 is significantly lower than the energy of absorption. This means that the wavelength of the emitted light will be longer than that of the absorbed light. The peaks are spread out due to fluctuations in bond lengths at temperature.

Figure 4:
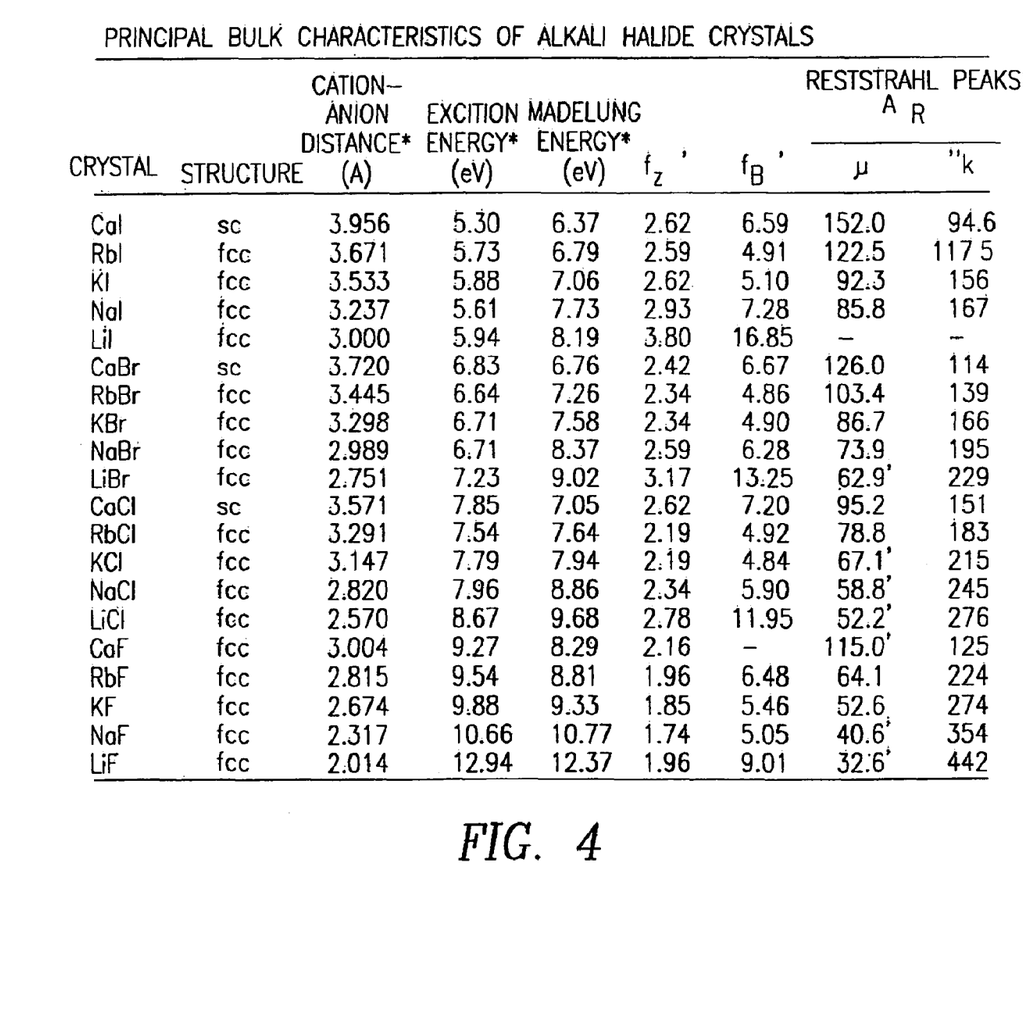
FIG. 4 is a table showing the principal bulk characteristics of alkali halide crystals.

Referring to FIG. 4, there is shown a table of energies of absorption and emission in many common ionic crystals. As one can see from FIG. 4, the crystal is depicted in the left-hand column with the cation and anion distance, the exciton energy and various other characteristics depicted. Such tables are well known and many examples exist in the prior art. In any event, one can understand from FIGS. 1 through 4 how color centers are formed and basically they describe an indication of the nature of such centers.

As will be explained subsequently, in the present invention there are two ways in which to create patterns of F-centers using ionic crystals. In the first way, collimated gamma rays are used to expose only certain areas of each crystal to the radiation necessary to produce crystal dislocation and therefore F-centers. The gamma radiation passes through both layers of crystals creating color centers in each crystal at the same location. As will be explained, because of the difference in absorption and emission wavelengths of each layer, the two crystals would activate at different wavelengths. Such a device is used to create color center lasers capable of lasing at two unique discrete frequencies.

Figure 5:
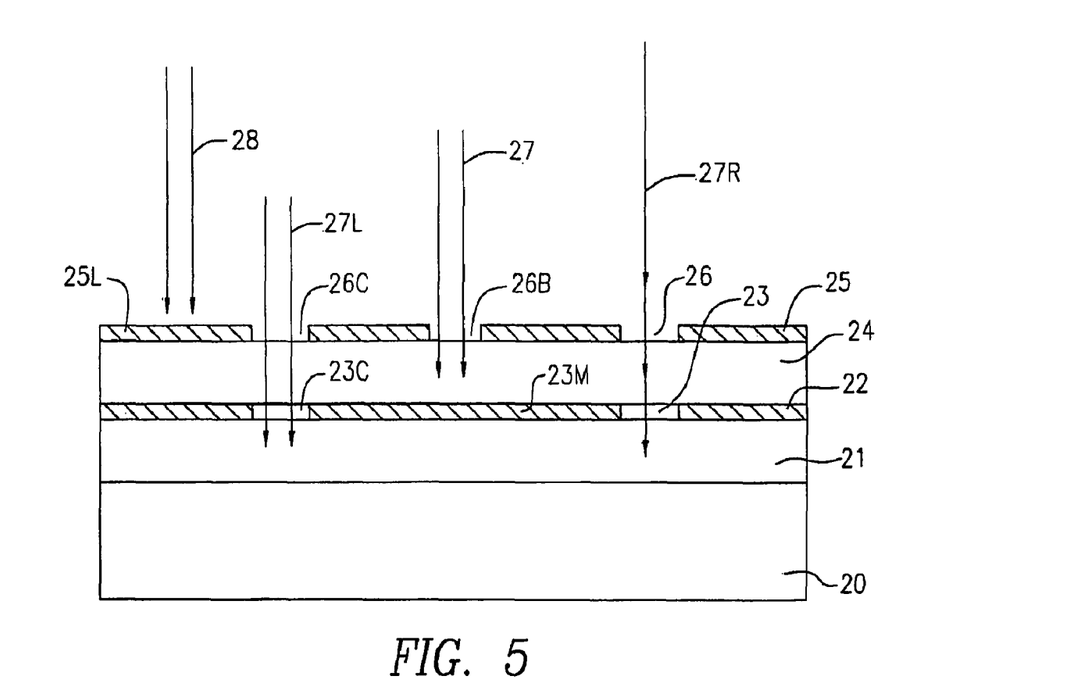
FIG. 5 is a cross sectional view depicting an embodiment of a device according to this invention.

Referring to FIG. 5, there is shown the following structure. Reference numeral 20 depicts a substrate upon which is grown a crystal such a NaCl or KCl or another crystal as shown, for example, in FIG. 4. The crystal is grown on substrate 20 by known crystal growing techniques and substrate 20 may consist of silicon, a metal, plastic or another substrate material upon which a crystal could be grown. The substrate is an inorganic material. The ionic crystal thickness is on the order of a few milliinches, but the thickness is not critical. It can be deposited on the substrate by sputtering. On top of the crystal layer 21 is a metal layer 22 which is deposited either by CVD or other metal deposition techniques as sputtering and so on. The metal layer 22 has openings or holes 23 and 23L. The metal layer is an inert metal as, for example, gold, platinum, or any other inert metal and is very thin as between 0.05 to 0.2 millimeters. Deposited on top of the metal layer 22 is a second layer 24, which is a thin layer of a different type of ionic crystal, which for example could be LIF or NaF. The layer 21 absorbs light at a wavelength different than the layer 24. As seen, deposited on top of layer 24 is another metal layer 25 which has openings 26, 26B and 26C. The openings 26, as one can see, are in alignment with openings 23, while opening 26B is associated with layer 24 and therefore gamma rays 27, which are directed through opening 26B, do not in any manner impinge on layer 21. Whereas, for example in the event of gamma rays 27L enter aperture 26C and pass through aperture 23C to impinge upon both layers 24 and layer 21. As can be seen, gamma rays 28 are absorbed by metal layer 25L and do not further enter the substrate.

As indicated, and as seen in FIG. 5, the holes 26 and 23 allow gamma rays to pass through. Therefore, the gamma rays 27 would pass through appropriate apertures 26 and impinge upon layer 24. Gamma rays will also pass through appropriate apertures 23 to impinge upon layer 21. Gamma rays 27 will pass through aperture 26 and be blocked by the metal layer 23M to prevent them from passing to layer 21. In a similar manner, gamma rays 27R pass through aperture 26C, to irradiate layer 24 and also impinge upon layer 21 as they pass through aperture 23. The use of gamma radiation as shown in FIG. 5 will produce the F-centers depicted in FIG. 6.

Figure 6:
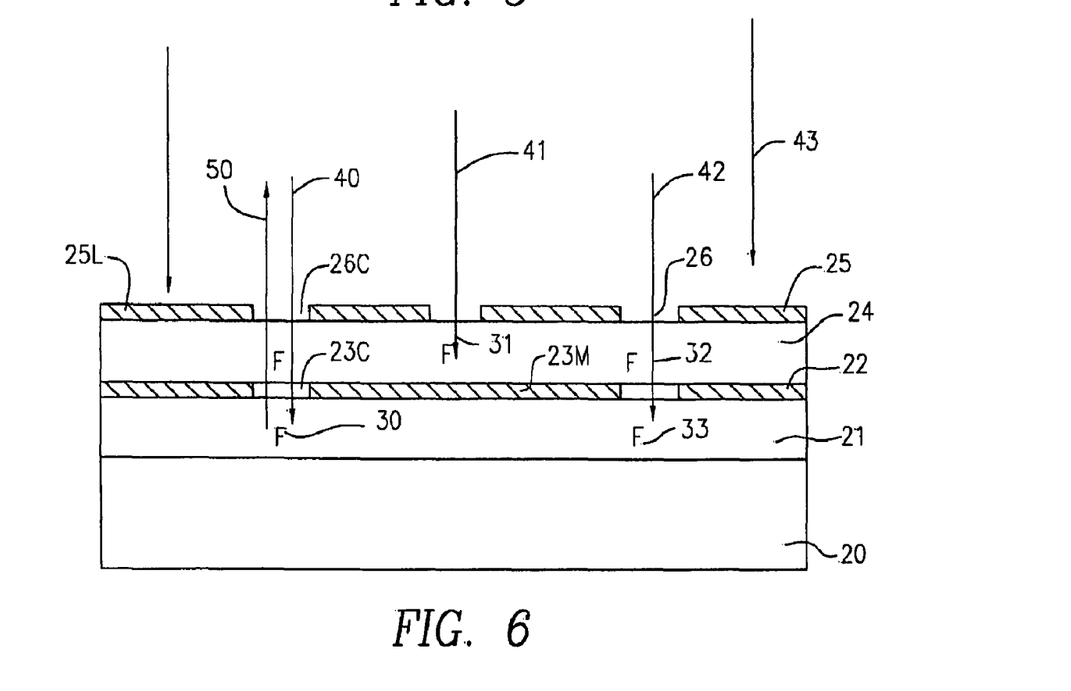
FIG. 6 depicts the device of FIG. 5 after being exposed to gamma rays.

In FIG. 6 there is shown the laminate device of FIG. 5 after being exposed to gamma rays. F-centers such as 30, 31, 32, 33 and so on are present. Essentially, FIG. 6 shows F-centers located at all areas that were exposed to radiation. Also shown in FIG. 6 are light beams such as 40, 41, 42 and 43. These light beams, for example, are light of the absorption wavelength of the lower ionic crystal. If the light beams 40, 41 and 43 are at absorption wavelengths of those of the lower ionic crystal, then the lower ionic crystal based on the F-centers in that layer will emit light as shown by reference numeral 50. Thus, light 40 which emanates and strikes layer 21 causes layer 21 to lase and emit light 50 at the emission wavelength of layer 21 due to the F-center. It is seen that light 41, which is of the same frequency as light 40, does not cause layer 24 to lase because of the different absorption frequency.

Figure 7:
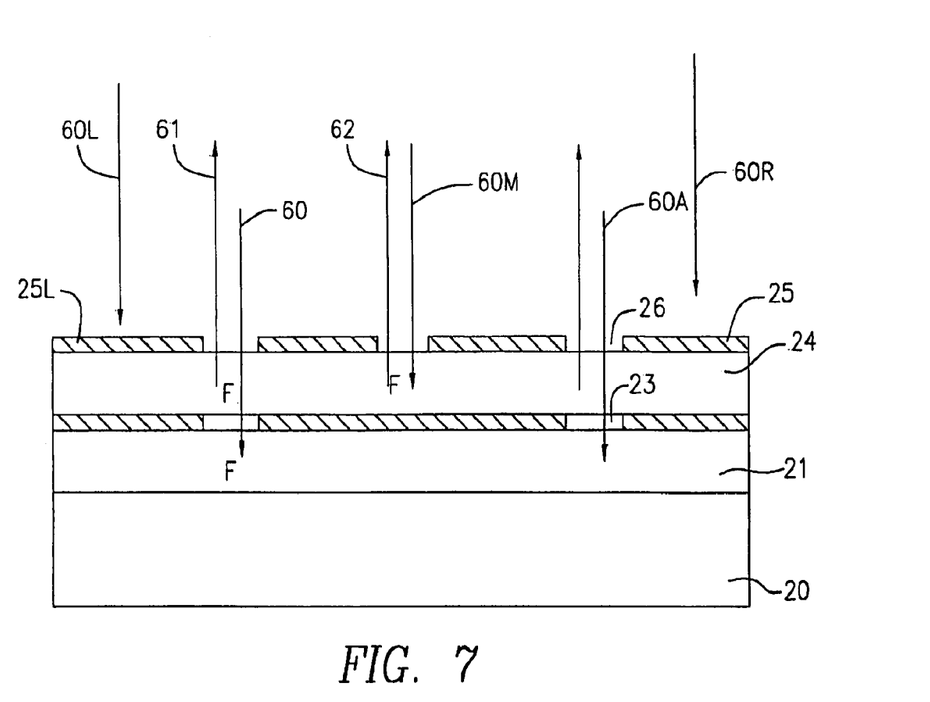
FIG. 7 is a cross-sectional view showing the device of FIGS. 5 and 6 exposed to light of the absorption wavelength of the top crystal layer.

FIG. 7 depicts a same device as shown in FIG. 6, except that the light 60, 60M and 60R depicted in FIG. 7 is of the absorption wavelength of the top crystal layer 24. Also shown in FIG. 7, only the top crystal layer emits light as, for example, rays 61 and 62, when light 60 impinges thereon. Light rays such as 60R and 60L which is the same frequency as light 60 impinge upon the metal surfaces 25 and 25L and thereby do not cause lasing. The lasing is caused because the structure depicted has the access holes such as 26 and 23 to enable light to be directed to either the top ionic crystal 24 or the bottom ionic crystal 21.

Figure 8:
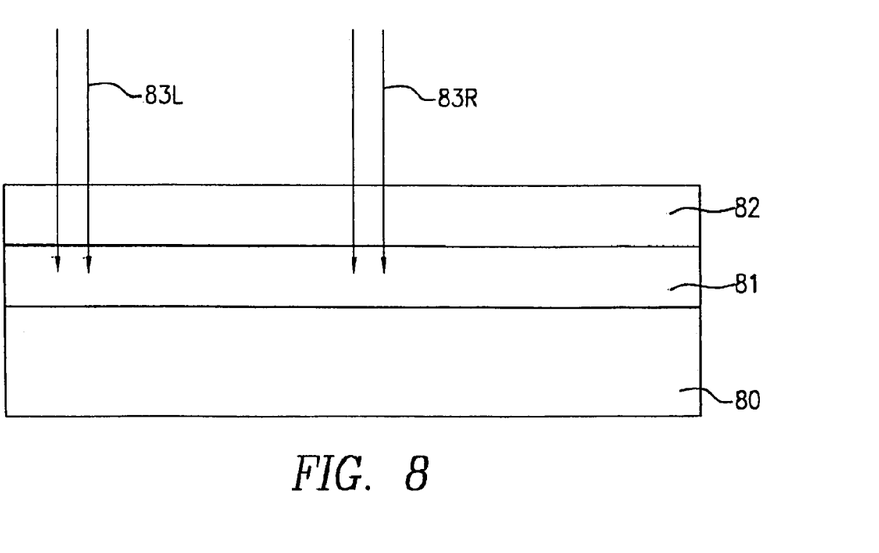
FIG. 8 shows another embodiment of a device according to this invention.
Figure 9:
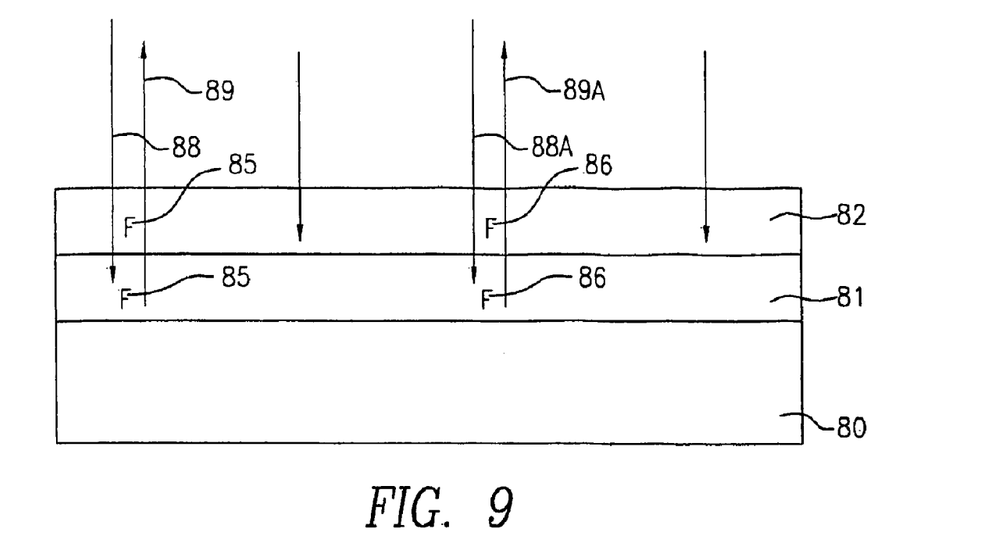
FIG. 9 shows the results of gamma irradiation on a device depicted in FIG. 8.

Referring to FIG. 8, there is shown still another embodiment of a device where essentially there is depicted a substrate 80 having deposited on a top surface a first ionic crystal layer 81. Deposited on top of first ionic crystal layer 81 is a second ionic crystal layer 82. Both ionic crystals have different absorption wavelengths as indicated above. In the embodiment of FIG. 8, collimated beams of gamma rays 83L and 83R are directed to both crystals at particular areas, which are selected spots. As can be seen, the difference between the structure in FIG. 7 and FIG. 8 is that the metal layers do not exist and therefore there are no particular holes, but a selected area of the device is now irradiated by collimated gamma rays, which essentially cause F-centers to appear. As seen in FIG. 9, the F-centers 85 and 86 will only appear where the collimated beams are incident.

Figure 10:
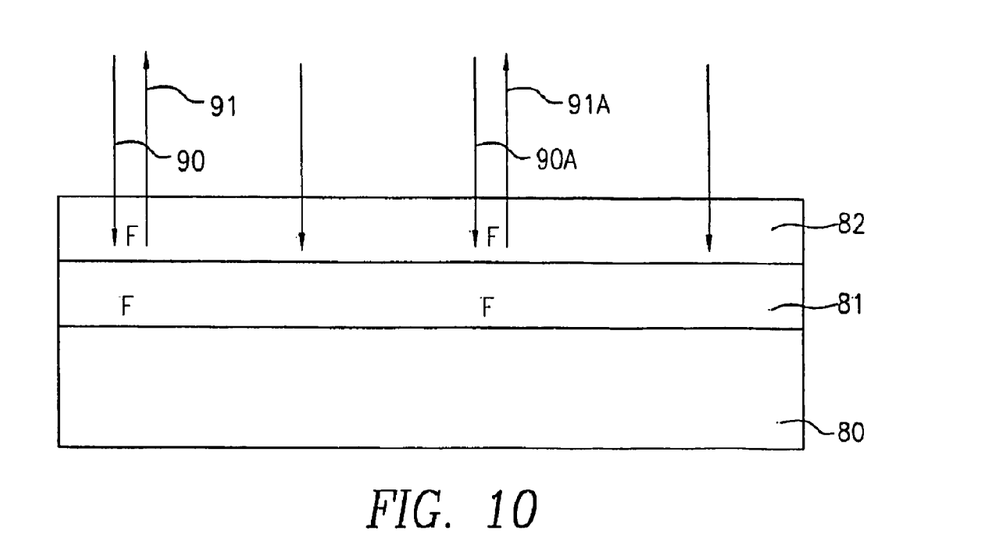
FIG. 10 shows the device of FIG. 8 operative with light of the characteristic absorption wavelength of the top layer incident on the device.

FIG. 9 shows the results of the gamma irradiation of the crystal layers. When light 88 and 88A of the absorption wavelength of the bottom layer 81 is directed on the crystal, the bottom crystal lases, producing output beam 89 and 89A. Since the wavelength of light is not the absorption wavelength of the top crystal 87, there is no lasing of the top crystal. However, in FIG. 10, light 90 and 90A, which has the characteristic absorption wavelength of the top layer 82, the top layer 82 produces output beams 91 and 91A. In this case, the F-centers of the top layer emit laser light 91 and 91A indicative of the top layer's emission wavelength.

Figure 11:
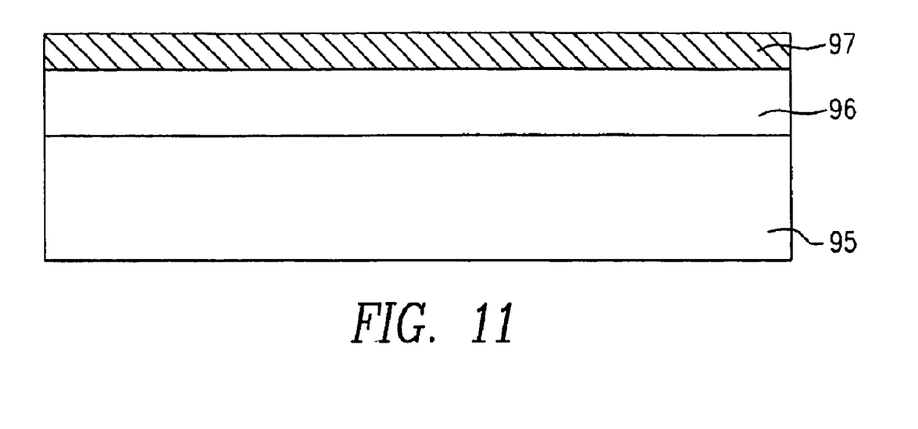
FIG. 11 shows still another embodiment of the device according to this invention.
Figure 12:
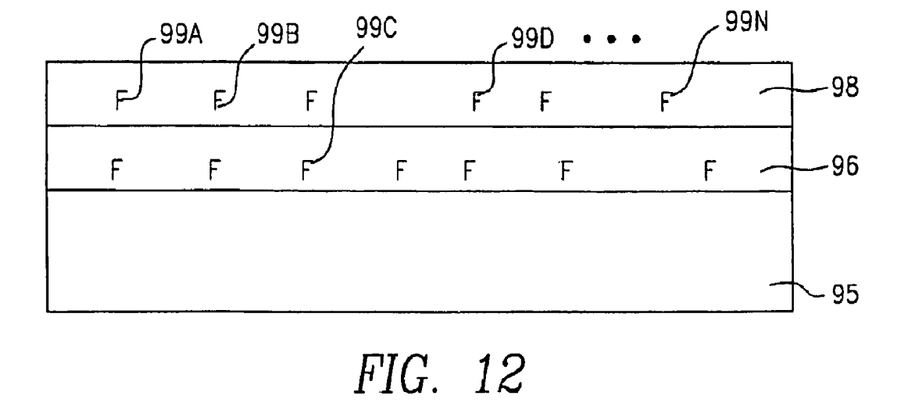
FIG. 12 shows the device of FIG. 11 after both the first and second layers have been treated with the anion layer and heated.

Referring to FIG. 11, there is shown still another embodiment. In FIG. 11, a substrate 95 has deposited thereon a first ionic crystal layer 96. Deposited on ionic crystal layer is an anion layer 97. The anion layer, when heated, an ionic crystal with F-centers (FIG. 12). The numerals F designate the F-centers, which are created when needed. As one can ascertain, there are F-centers as 99A, 99B and 99N. These F-centers are distributed throughout the layers and therefore when light, again of a particular frequency indicative of the top layer 98 or the bottom layer 96 is incident upon the device, the device will emit or lase light based on the emission wavelength of the layers. Thus, as one can ascertain from the present invention, F-centers are created by collimated gamma rays, which expose only certain areas of each crystal to the radiation necessary to produce crystal dislocation and therefore, F-centers. The gamma radiation passes through both layers of crystals, creating color centers in each crystal at the same location. However, because of the difference in absorption and emission wavelengths of each layer, the two crystals activate at different wavelengths. The device depicted is utilized to create color center lasers capable of lasing at two unique frequencies.

The second way of producing patterns of F-centers is by masking each layer with a thin layer of metal. This is depicted, for example, in FIGS. 5, 6 and 7. A layer of metal is deposited on the first layer of crystal and then etched to form a pattern of holes before the second ionic layer is deposited. A final layer of metal is then deposited over the second layer of crystal. This second layer can also be patterned such that some of the holes coincide with the holes of the first layer and some of them are unique to the second layer. In this layer collimated gamma ray beams can be swept or scanned over various parts of the device. If the beam is aimed at a hole that is in both layers of metal, then both ionic crystals will be exposed and become colored. If the beam passes over a hole that is only in the top layer of metal, then the top crystal will be the only one with color centers at that location. In this way, the bottom crystal layer will have a pattern that is only part of the pattern contained on the top layer. This allows the device to display two different patterns, depending on the wavelength on light incident on the surface.

Another way of producing the F-centers in the two layers does not involve gamma rays. This is depicted, for example, in FIGS. 11 and 12. It is known that if an ionic crystal is heated in the present of excess anions, F-centers can be formed in the material. In the present device, after each ionic layer is deposited, a thin layer of the anion alone, such as sodium in the case of sodium chloride, is deposited in the top. This material is then heated so that F-centers are formed in the crystal. Then the second layer is added and another layer of different anion is deposited and the whole device is heated again. In this case, there is no need for a metal masking layer, as the entire ionic layer will generate F-centers. This technique will be useful in the creating of other layers in the two different lasing frequencies.

It is, of course, understood that such a device having two different lasing frequencies is extremely useful and many applications, such as the transmission of information along optical fibers and other uses can be employed as well. The device can be used to create two color displays as reference numerals or other display by scanning with proper light beam. While the above-noted invention was described in terms of specific embodiments, it should be understood by those skilled in the art that many alternate embodiments could be employed as well without departing from the spirit and scope of this invention.

The invention claimed is:

1. A method of fabricating a color center laser, the method comprising:
    forming a first ionic crystal layer on a substrate;
    depositing a first metal layer on the first ionic crystal layer, the first metal layer having a first plurality of apertures;
    forming color centers in the first ionic layer;
    depositing a second ionic crystal layer on the first metal layer;
    depositing a second metal layer on the second ionic crystal layer, the second metal layer having a second plurality of apertures; and
    forming color centers in the second ionic crystal layer.
2. The method of claim 1, wherein forming color centers in the first ionic crystal layer comprises exposing the first ionic crystal layer to gamma rays through the first plurality of apertures.

3. The method of claim 1, wherein forming color centers in the second ionic crystal layer comprises exposing the second ionic crystal layer to gamma rays through the second plurality of apertures.

4. The method of claim 1, wherein the first ionic crystal layer, second ionic crystal layer, first metal layer, and second metal layer form a laminate.

5. The method of claim 1, wherein the first plurality of apertures are arranged in a first pattern and the second plurality of apertures are arranged in a second pattern, wherein the first pattern and the second pattern are different.

6. The method of claim 1, wherein the first plurality of apertures are aligned with the second plurality of apertures.

7. The method of claim 1, wherein the first metal layer and second metal layer are inert metals.

8. The method of claim 1, wherein the first ionic crystal layer and the second ionic crystal layer are alkali halides.

9. The method of claim 8, wherein the first ionic crystal layer alkali halide is distinct from the second ionic crystal layer alkali halide.

10. The method of claim 1, wherein the second ionic crystal layer has a greater absorption energy than the first ionic crystal layer.

11. A method of fabricating a color center laser, the method comprising:
    forming a first ionic crystal layer on a substrate;
    exposing the first ionic crystal layer to collimated beams of gamma rays to form a first plurality of color centers arranged in a first color center pattern;
    depositing a first inert metal layer on the first ionic crystal layer;
    depositing a second ionic crystal layer on the first inert metal layer;
    exposing the second ionic crystal layer to collimated beams of gamma rays to form a second plurality of color centers arranged in a second color center pattern; and
    depositing a second inert metal layer on the second ionic crystal layer.

12. The method of claim 11, wherein the first color center pattern is distinct from the second color center pattern.

13. The method of claim 11, wherein the first ionic crystal layer has a first absorption frequency and the second ionic crystal layer has a second absorption frequency, wherein the second absorption frequency is greater than the first absorption frequency.

14. The method of claim 13, wherein the first ionic crystal layer, second ionic crystal layer, first inert metal layer, and second inert metal layer form a laminate.

15. The method of claim 14, further comprising radiating the laminate with light indicative of the first absorption frequency to cause the laminate to lase at a first frequency.

16. The method of claim 14, further comprising radiating the laminate with light indicative of the second absorption frequency to cause the laminate to lase at a second frequency.

17. The method of claim 11, wherein the first ionic crystal layer and the second ionic crystal layer are alkali halides.

18. The method of claim 17, wherein the first ionic crystal layer alkali halide is distinct from the second ionic crystal layer alkali halide.

\* \* \* \* \*